(12) United States Patent
Furman et al.

(10) Patent No.: US 7,865,808 B2
(45) Date of Patent: Jan. 4, 2011

(54) FAST ERROR DETECTION SYSTEM AND RELATED METHODS

(75) Inventors: William N. Furman, Fairport, NY (US); John W. Nieto, Rochester, NY (US)

(73) Assignee: Harris Corporation, Melbourne, FL (US)

( * ) Notice: Subject to any disclaimer, the term of this patent is extended or adjusted under 35 U.S.C. 154(b) by 909 days.

(21) Appl. No.: 11/746,091

(22) Filed: May 9, 2007

(65) Prior Publication Data

US 2008/0279109 A1 Nov. 13, 2008

(51) Int. Cl.
*H03M 13/00* (2006.01)
(52) U.S. Cl. .................................. 714/781; 714/759
(58) Field of Classification Search .............. 714/781, 714/759
See application file for complete search history.

(56) References Cited

U.S. PATENT DOCUMENTS

| | | | |
|---|---|---|---|
| 6,263,470 B1 * | 7/2001 | Hung et al. | 714/784 |
| 6,836,869 B1 | 12/2004 | Wyland | 714/781 |
| 7,162,661 B2 | 1/2007 | Mudge et al. | 714/10 |
| 7,174,498 B2 * | 2/2007 | Weissinger | 714/785 |
| 7,668,248 B2 * | 2/2010 | Hocevar | 375/260 |
| 2004/0078555 A1 | 4/2004 | Porten et al. | 712/221 |
| 2004/0218666 A1 | 11/2004 | Holcomb et al. | 375/224 |
| 2004/0243908 A1 * | 12/2004 | Box et al. | 714/759 |
| 2006/0179273 A1 | 8/2006 | Cole et al. | 712/34 |

OTHER PUBLICATIONS

Filipg: "A Painless Guide to CRC Error Detection Algorihms Index V3.00" Internet Citation [Online] Sep. 24, 1996, pp. 1-33, XP00217899 Retrieved from the Internet: URL http://www.repairfaq.org/filipg/link/f_crc_v3.html> [retrieved on Jul. 16, 2001].

* cited by examiner

*Primary Examiner*—M. Mujtaba K Chaudry
*Assistant Examiner*—Enam Ahmed
(74) *Attorney, Agent, or Firm*—Allen, Dyer, Doppelt, Milbrath & Gilchrist, P.A.

(57) ABSTRACT

A system apparatus and method generates a communications signal having an error detection mechanism. A circuit generates a data packet. An encoder multiplies and accumulates data words with values in a distance table containing non-repeated n-bit multipliers having "m" number of one bits that are set to obtain accumulated sum bits and appends the accumulated sum bits to the data packet as an error detection code to form a communications signal to be transmitted.

17 Claims, 7 Drawing Sheets

```
UNSIGNED16 CrcDistance [750] ={
0x203e,  0x304f,  0x216d,  0x2217,  0x29c9,  0x260f,  0x289d,  0x3704,  0x213d,  0x21bc,
0x21cc,  0x2761,  0x344d,  0x22c5,  0x211b,  0x201f,  0x268a,  0x2271,  0x20be,  0x3c31,
0x2695,  0x2517,  0x2427,  0x2593,  0x34a3,  0x2199,  0x214e,  0x22b9,  0x2d8c,  0x248e,
0x226e,  0x3a32,  0x2073,  0x26cc,  0x,21c7,  0x2f30,  0x21a7,  0x324d,  0x2077,  0x3047,
0x2156,  0x2b24,  0x28c7,  0x208f,  0x292a,  0x2197,  0x20b7,  0x20bb,  0x2cca,  0x3d11,
0x2037,  0x3f00,  0x20ab,  0x2075,  0x2364,  0x20e9,  0x2361,  0x3543,  0x2395,  0x21a6,
0x25e4,  0x21d3,  0x209d,  0x261d,  0x3398,  0x2ae2,  0x2798,  0x2057,  0x218e,  0x3658,
0x254c,  0x215d,  0x2a4b,  0x2247,  0x2749,  0x2709,  0x20ea,  0x22d8,  0x21ab,  0x2169,
0x2371,  0x227a,  0x209e,  0x3226,  0x2760,  0x207b,  0x2157,  0x328e,  0x,2617,  0x3702,
0x232a,  0x20de,  0x260b,  0x211e,  0x252a,  0x2f81,  0x20e5,  0x205b,  0x254e,  0x224d,
0x205f,  0x30ad,  0x234e,  0x20e6,  0x23c4,  0x225a,  0x2ad1,  0x2475,  0x28ae,  0x20db,
0x2437,  0x202f,  0x261e,  0x2da4,  0x2398,  0x2d43,  0x34d8,  0x2718,  0x250e,  0x24b9,
0x3d06,  0x2715,  0x251d,  0x28e1,  0x212d,  0x206f,  0x206e,  0x22e4,  0x2d4c,  0x22a6,
0x2837,  0x2079,  0x3383,  0x3c2c,  0x2fc0,  0x203f,  0x391a,  0x3311,  0x282f,  0x26b2,
0x217c,  0x3ce0,  0x287f,  0x20dd,  0x2263,  0x25d8,  0x3415,  0x288b,  0x21b9,  0x253a,
0x209b,  0x294b,  0x2a0f,  0x20b9,  0x2179,  0x215a,  0x2c38,  0x20e3,  0x218b,  0x3507,
0x211f,  0x26c3,  0x2555,  0x2629,  0x2097,  0x3c28,  0x281d,  0x2139,  0x2316,  0x20d6,
0x370c,  0x207c,  0x2257,  0x2ae0,  0x242f,  0x21e6,  0x2551,  0x20b3,  0x24b5,  0x229e,
0x203b,  0x20ae,  0x2497,  0x212f,  0x283e,  0x3324,  0x216b,  0x2786,  0x234d,  0x20f3,
0x22b3,  0x3591,  0x3a0e,  0x2165,  0x32d0,  0x26c9,  0x2353,  0x3b0a,  0x30c7,  0x3869,
0x3269,  0x21ac,  0x223a,  0x203d,  0x2018,  0x216e,  0x320b,  0x259c,  0x2867,  0x2f21,
0x20b6,  0x214f,  0x24dc,  0x222e,  0x2856,  0x23b0,  0x20bc,  0x2076,  0x229c,  0x207a,
0x2a19,  0x2691,  0x20ed,  0x289b,  0x22f1,  0x2939,  0x2e29,  0x3433,  0x2c4d,  0x21d2,
0x2447,  0x219a,  0x232e,  0x226d,  0x2965,  0x20f5,  0x2396,  0x26d8,  0x2187,  0x207d,
0x241e,  0x2a0d,  0x2589,  0x3315,  0x20cf,  0x309a,  0x2396,  0x2553,  0x21e3,  0x2f42,
0x3c15,  0x23e1,  0x2631,  0x20bd,  0x292d,  0x2723,  0x20f6,  0x2335,  0x22ea,  0x215e,
```

FIG. 3

| BER | TABLE 16 | | FAST 16 | | STANDARD 32 | | FAST 32 | |
|---|---|---|---|---|---|---|---|---|
| 1.00E-07 | 0 | 0.00E+00 | 0 | 0.00E+00 | 0 | 0.00E+00 | 0 | 0.00E+00 |
| 1.00E-06 | 0 | 0.00E+00 | 0 | 0.00E+00 | 0 | 0.00E+00 | 0 | 0.00E+00 |
| 1.00E-05 | 0 | 0.00E+00 | 0 | 0.00E+00 | 0 | 0.00E+00 | 0 | 0.00E+00 |
| 1.00E-04 | 0 | 0.00E+00 | 0 | 0.00E+00 | 0 | 0.00E+00 | 0 | 0.00E+00 |
| 1.00E-03 | 0 | 0.00E+00 | 0 | 0.00E+00 | 0 | 0.00E+00 | 0 | 0.00E+00 |
| 1.00E-02 | 378 | 3.78E-06 | 331 | 3.31E-06 | 0 | 0.00E+00 | 5 | 5.00E-08 |
| 1.00E-01 | 1537 | 1.54E-05 | 1471 | 1.47E-05 | 0 | 0.00E+00 | 0 | 0.00E+00 |
| 2.00E-01 | 1418 | 1.42E-05 | 1530 | 1.53E-05 | 0 | 0.00E+00 | 0 | 0.00E+00 |
| 3.00E-01 | 1547 | 1.55E-05 | 1573 | 1.57E-05 | 0 | 0.00E+00 | 0 | 0.00E+00 |
| 4.00E-01 | 1536 | 1.54E-05 | 1599 | 1.60E-05 | 0 | 0.00E+00 | 0 | 0.00E+00 |
| 5.00E-01 | 1473 | 1.47E-05 | 1527 | 1.53E-05 | 0 | 0.00E+00 | 0 | 0.00E+00 |

FIG. 4

| BER | TABLE 16 | | FAST 16 | | STANDARD 32 | | FAST 32 | |
|---|---|---|---|---|---|---|---|---|
| 1.00E-07 | 0 | 0.00E+00 | 0 | 0.00E+00 | 0 | 0.00E+00 | 0 | 0.00E+00 |
| 1.00E-06 | 0 | 0.00E+00 | 0 | 0.00E+00 | 0 | 0.00E+00 | 0 | 0.00E+00 |
| 1.00E-05 | 0 | 0.00E+00 | 2 | 2.00E-07 | 0 | 0.00E+00 | 0 | 0.00E+00 |
| 1.00E-04 | 15 | 1.50E-06 | 52 | 5.20E-06 | 0 | 0.00E+00 | 4 | 4.00E-07 |
| 1.00E-03 | 160 | 1.60E-05 | 126 | 1.26E-05 | 0 | 0.00E+00 | 0 | 0.00E+00 |
| 1.00E-02 | 135 | 1.35E-05 | 152 | 1.52E-05 | 0 | 0.00E+00 | 0 | 0.00E+00 |
| 1.00E-01 | 158 | 1.58E-05 | 157 | 1.57E-05 | 0 | 0.00E+00 | 0 | 0.00E+00 |
| 1.00E-01 | 159 | 1.59E-05 | 147 | 1.47E-05 | 0 | 0.00E+00 | 0 | 0.00E+00 |
| 2.00E-01 | 147 | 1.47E-05 | 169 | 1.69E-05 | 0 | 0.00E+00 | 0 | 0.00E+00 |
| 3.00E-01 | 144 | 1.44E-05 | 127 | 1.27E-05 | 0 | 0.00E+00 | 0 | 0.00E+00 |
| 4.00E-01 | 158 | 1.58E-05 | 155 | 1.55E-05 | 0 | 0.00E+00 | 0 | 0.00E+00 |

FIG. 5

FAST ERROR DETECTION SYSTEM AND RELATED METHODS

FIELD OF THE INVENTION

The present invention relates to the field of communications, and, more particularly, to error detection in communications systems and related methods.

BACKGROUND OF THE INVENTION

Cyclic redundancy check (CRC) codes are often used to detect errors in a block of transmitted bits. In general, an N bit CRC code will have a probability of failure of $(\frac{1}{2})^N$ which occurs in a very high noise environment. Values of 8, 16 and 32 are common for N. A failure is defined as the code check passing when there are errors in the message. A second failure mode exists when there are no errors in the message but the CRC check fails, signifying that one or more of the CRC bits were in error. This mechanism occurs much less frequently and the associated cost of discarding a good message is small.

Modern data networking communication systems are relying more and more on burst transmissions to perform network command and control functions as well as the transmission of burst data. Since, it is standard practice in industry to use a CRC code for error detection, each packet or burst of data includes a CRC code with its data. This allows the receiver to determine with fairly high accuracy if the received bits are correct. The disadvantage of this technique, however, is that it adds overhead to the transmission by requiring the transmission of extra bits. The CRC bits that are appended to the data message to send over the air can be calculated in a number of different ways but often rely on feedback shift-register architectures, where all the bits of the entire message to be encoded are passed through the shift-register. The CRC bits are the state of the shift-registers at the conclusion of the process. Standard sizes for CRC codes used in industry are 32, 16 and 8 bits. For short burst transmissions these may end up being a significant portion of a transmission.

As noted above, cyclic redundancy check (CRC) codes are commonly used in many packetized data transmissions to provide error detection. The CRC is an additional 8, 16 or 32 bits that are sent along with the packetized data. A receiver recalculates the CRC and checks it against the received CRC to determine if the received packet is error free.

As the data rates increases, however, the time allowed to implement the CRC processing decreases, which creates loading and latency issues in the system. It would be advantageous if an alternative fast error detection (FED) mechanism with a performance similar to a standard CRC could be provided which can be implemented in a computationally efficient form suited for digital signal processor (DSP) technology often used in modern radios, for example, software defined radios and/or cognitive radio systems.

SUMMARY OF THE INVENTION

A system apparatus and method generates a communications signal having a fast error detection (FED) mechanism. Standard circuit generates a data packet. FED words are generated by multiplying each data word from the packet with a unique value contained in a distance table array and summed together. The resulting sum is further processed to generate the desired length of error detection (i.e. 8-bit, 16-bit, 32-bit) and appended to the data packet as a FED code to form a communications signal to be transmitted.

In one non-limiting aspect, a digital signal processor (DSP) has a multiply/accumulate (MAC) unit and equivalent assembler instruction for multiplying and accumulating values from the distance table with the data words. The DSP is operative for computing a product of two 16-bit numbers and adding the result to the accumulator.

The circuit that generates a data packet and the DSP can be implemented in software-defined radio. The FED encoder can multiply the data words with values from the distance table containing 16-bit numbers. In a preferred embodiment, each value in the distance table contains "M" one values (where M is a number between 1 and 16, preferably six or seven). The FED encoder can be operative for obtaining "x" number of bits as a first number of sum bits (i.e. number of bits for accumulator function) and reducing the "x" sum bits down to "y" bits. "X" can be 32, 40, or 64 bits and "y" can be 8, 16 or 32 bits.

A parity bit can also be used to replace one of the bits of the computed FED bits appended to the data packet. The values of the distance table can be pre-computed and optimized to provide good distance properties for bits in error.

The system can also include a receiver that receives the communications signal after it is transmitted. An error detection mechanism can process the signal using the values of the distance table to detect errors in communication based on the FED bits appended to the data packet.

A method aspect is also set forth.

BRIEF DESCRIPTION OF THE DRAWINGS

Other objects, features and advantages of the present invention will become apparent from the detailed description of the invention which follows, when considered in light of the accompanying drawings in which:

FIG. 3 is an example of a distance table having values that can be used for calculating the FED bits in accordance with a non-limiting example of the present invention.

FIG. 4 is a table showing performance results for 100,000,000 192-bit packets in accordance with a non-limiting example of the present invention.

FIG. 5 is another table showing performance results for 10 million, 12,000-bit packets in accordance with a non-limiting example of the present invention.

DETAILED DESCRIPTION OF THE PREFERRED EMBODIMENTS

Figure 1:
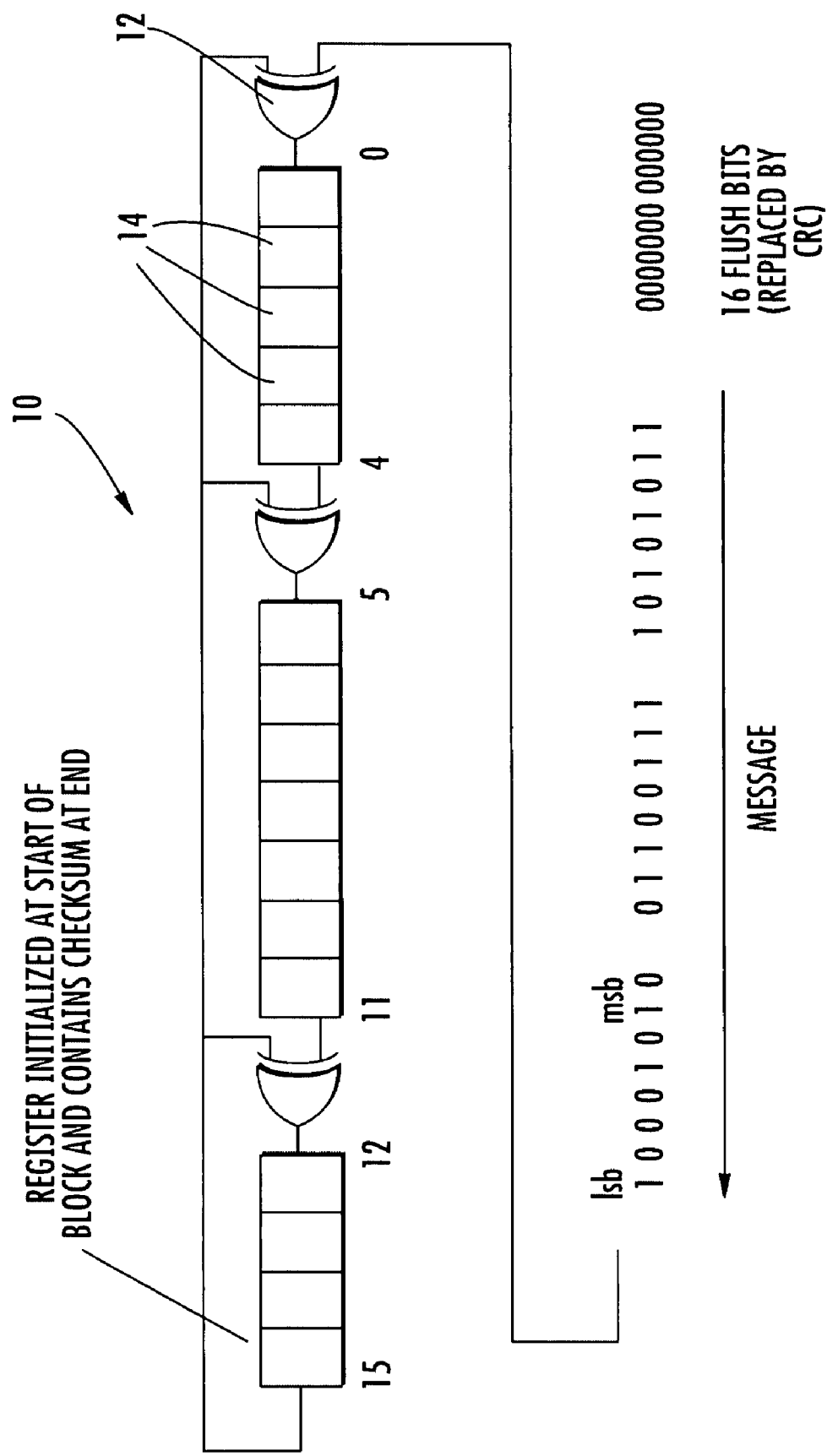
FIG. 1 is an example of a prior art shift register with feedback that can be used for processing a standard CRC.

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

In accordance with non-limiting examples of the present invention, the system, method and device can use a fast multiply-accumulate (MAC) unit of a digital signal processor (DSP) or elements of a Field Programmable Gate Array (FPGA) to generate an error detection mechanism similar to a standard cyclic redundancy check (CRC). The system, method and device is more efficient than standard or table-based CRC implementations. In accordance with non-limiting examples, the use of a spreading "distance table" minimizes error alignment and cancellation, and has a performance similar to CRC techniques.

As will be appreciated by those skilled in the art, portions of the present invention may be embodied as a method, data processing system, or computer program product. Accordingly, these portions may take the form of an entirely hardware embodiment, an entirely software embodiment, or an embodiment combining software and hardware aspects. Furthermore, a computer program product on a computer-usable storage medium having computer readable program code on the medium can be used. Any suitable computer readable medium may be used including, but not limited to, static and dynamic storage devices, hard disks, optical storage devices, and magnetic storage devices.

The present invention is described below with reference to block diagram and flowchart illustrations of methods, systems, and computer program products according to non-limiting embodiments. It will be understood that blocks of the illustrations, and combinations of blocks in the illustrations, can be implemented by computer program instructions, which may be provided to a processor of a general purpose computer, special purpose computer, or other programmable data processing apparatus to produce a machine, such that the instructions, which execute via the processor of the computer or other programmable data processing apparatus, implement the functions specified in the block or blocks.

These computer program instructions may also be stored in a computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

It should be understood that a CRC is typically a hash function that produces a checksum as a small, fixed number of bits against a block of data, for example, a packet of network traffic that detects errors after transmission. Usually, transmitted messages can be divided into predetermined lengths that are divided by a fixed divisor. According to the CRC calculation, the remainder number is appended onto and sent with a message. As the message is received, a processor at the receiver recalculates the remainder and compares it to the transmitted remainder. If any numbers do not match, an error is considered to be detected.

Usually a CRC "checksum" is the remainder of a binary division with no bit carry (XOR) used, instead of a subtraction of the message bit stream by a predefined or short bit stream of length N+1, which represents the coefficients of a polynomial with a degree N. Usually N zeros are appended to the message stream before the division. There are different variations of a CRC. For example, it is possible to run a CRC calculation on an entire code word or initialize a shift register with 1's instead of 0's (or any other value), or invert the CRC before it is appended to the message stream.

FIG. 1 illustrates a shift register 10 for a standard CRC with feedback. As illustrated, exclusive OR gates 12 are connected to various registers 14. The shift register 10 is initialized at the start of a block and contains the checksum at the end. In this example, 16 flush bits can be replaced by the CRC. The least significant bit (lsb) is shown at the left and the most significant bit (msb) at the right.

As discussed, communication systems may use burst transmissions to perform network command and control functions for the transmission of burst data. Each packet or burst of data includes a CRC code with its data. This allows the receiver to determine with fairly high accuracy if the received bits are correct. The transmitted CRC bits can be calculated in a number of different ways, but most techniques rely on the feedback register architecture where the entire message to be encoded is passed into the register. The final CRC bits are the state of the register at the conclusion of the process. Standard sizes for CRC's used in industry are 32, 16 and 8 bits. For short burst transmissions, these CRC's may become a significant portion of a transmission.

A register is typically a semiconductor device that stores several bits of digital data. It basically includes a set of flip-flops, with each flip-flop representing one bit of the register. Thus, an n-bit register has n flip-flops. A basic register is also known as a "latch."

The shift register transfers bits of data from one flip-flop to another in the "shifting" process. Shift registers are useful for transferring data in a serial manner while allowing parallel access to the data. Usually, the flip-flops are interconnected in such a way that the input to a flip-flop is the output of the one before it. Clocking all the flip-flops at the same time will cause the bits of data to shift or move toward the last flip-flop. A shift-register can also be implemented in software or a computer or Field Programmable Gate Array (FPGA) as would be appreciated by those skilled in the art.

CRC codes may be generated by an M state feedback shift register. The flip-flops of the feedback shift register are placed in a known state and the N message bits are shifted into the structure. The input bits are added (exclusive-or'd) with several of the bits of the shift register, for example. The result is shifted into the shift register. The M bit state of the feedback shift register, after all message bits have been shifted into it, is known as the CRC code. The CRC bits can be transmitted along with the message bits to provide error detection capability. Those skilled in the art will appreciate that other techniques for generating the CRC code may also be used.

At the receive site, all of the transmitted bits, including the message bits and appended CRC bits, are processed by an equivalent shift register based device. The resulting state of the receive shift register will typically be zeros if there are no errors in the transmission. Another method to determine CRC errors is to shift the N message bits through the shift register and then implement a Xor function with the received M CRC bits. Of course, other techniques may also be available as would be appreciated by the skilled artisan.

Some existing systems use a look-up table to calculate the CRC based on 16-bit input words instead of the bit-by-bit processing of the shift register. An examples of a pseudo-code used in such system and method is set forth below:

```
UNSIGNED16 CalcCrc( const UNSIGNED16* Buf,
UNSIGNED16 BufLenInChars )
{
        /* Calculate the CRC over Buf */
    for ( ; i < BufLenInChars; ++i )
    {
        TableIndex = (theCrc >> 8) & 0x00ff;
        theCrc = (theCrc << 8) | (Buf[i] >> 8);
        theCrc ^= CrcTable[TableIndex];
        TableIndex = (theCrc >> 8) & 0x00ff;
        theCrc = (theCrc << 8) | (Buf[i] & 0x00ff);
        theCrc ^= CrcTable[TableIndex];
    }
    return theCrc;
}
```

In accordance with a non-limiting example of the present invention, the fast multiply-accumulate feature such as part of a MAC unit available on many DSP devices (1/cycle) can be used to obtain a pseudo-CRC (i.e. FED) for use in non-limiting examples of the present invention. The system and method multiplies 16-bit data words, for example, with a "distance table," which is pre-computed and optimized to give any bit errors some redundancy and distance. For example, (i=0; i<num_words; i++) sum+=data[i]*distance[i].

The "distance table" contains non-repeated 16-bit multipliers that have "m" "1" (one) bits. Six or seven bits have been found to be sufficient. Bit 0x02000 is always set in one non-limiting embodiment, which can be a preferred embodiment. The sum is "x" number of bits, for example, either 32, 40 or 64 bits in one non-limiting example. A final manipulation stage reduces the sum bits down to a "y" number of bits, such as 8, 16 or 32. Optionally, bit 0 (zero) of the result is replaced with a parity bit. This implementation has been benchmarked at 40 times faster than the 8-bit table look-up method using code as described above for a 16-bit CRC on a state-of-the-art DSP.

Typically, the multiply-accumulate function is operative in a multiply and accumulate (MAC) unit as part of a DSP. It computes a product and adds the result to an accumulator. This operation can be accomplished with integers as a computed modulo of a power of two. With floating point numbers, the process can be performed with two roundings. In many digital signal processors, it can be accomplished with a single rounding, called a fused multiply-add (FMA). Generally, the MAC unit takes a stream of numbers that are scaled and summed.

A MAC unit can be formed as a multiplier implemented in combinational logic and followed, by an adder and an accumulator register, which stores the result when clocked. The output of the register is fed back to one input of the adder, such that on each clock, the output of the multiplier is added to the register. Some combinational multipliers require a large amount of logic, but can compute a product more quickly than an alternative method of shifting and adding.

Figure 2:
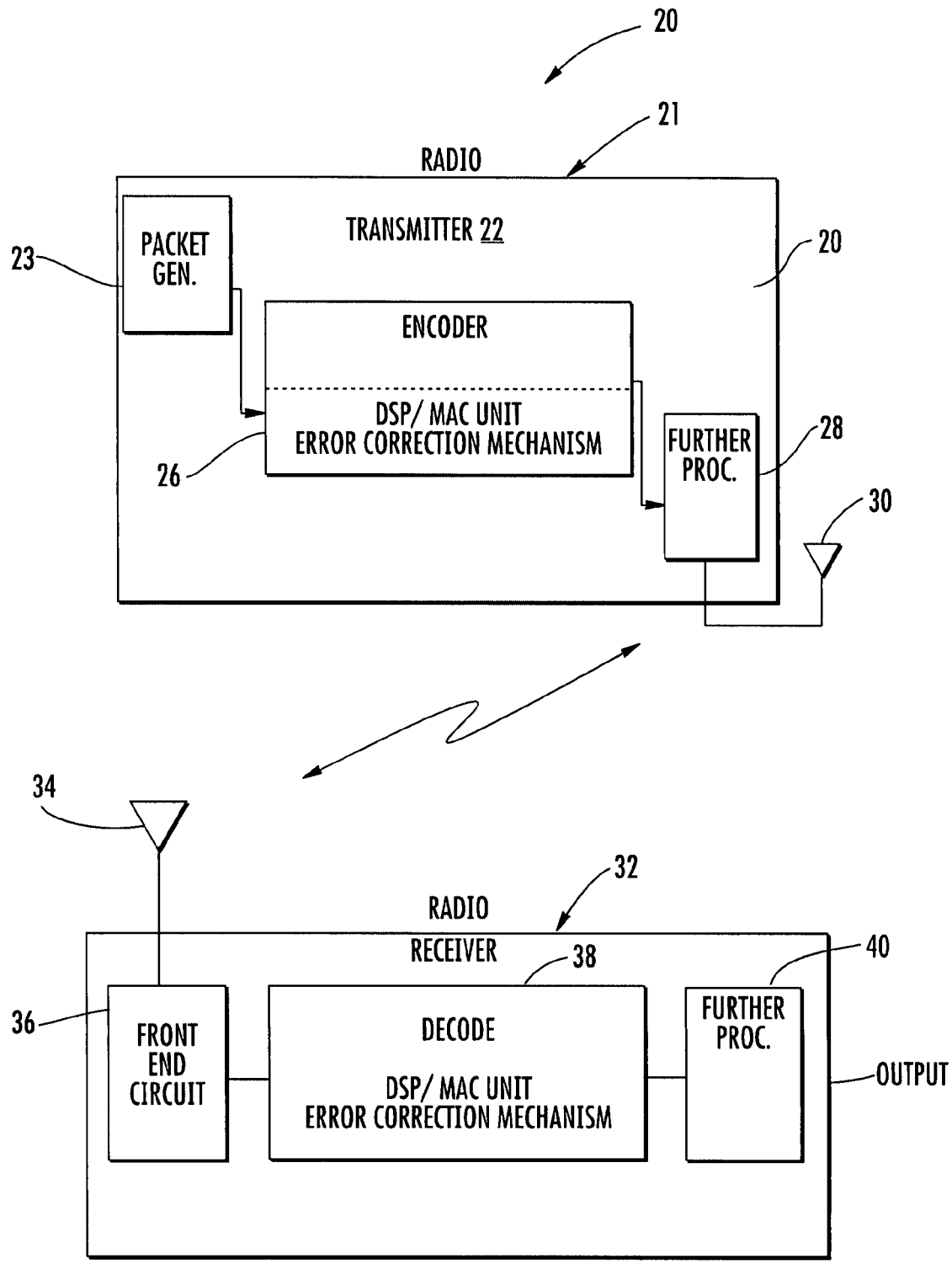
FIG. 2 is a block diagram of a communications system showing a transmitter and receiver that processes a FED mechanism in accordance with a non-limiting example of the present invention.

FIG. 2 illustrates a communications system 20 in accordance with a non-limiting example of the present invention. A radio 21 includes a transmitter section 22 having radio circuitry such as part of a software-defined radio. A packet generator 23 generates communications packets as payload data. An encoder 26 includes a DSP unit and multiply/accumulate (MAC) unit that receives a packet and appends the sum bits as the error detection code explained above to form a communications signal, which can be further processed in the circuit 28 and transmitted via the antenna 30. Circuit 28 can include other coding, modulation, and signal circuits as necessary.

A receiver 32 receives signals via antenna 34 from the transmitter 22, processes the signals in a front-end circuit 36, and conducts error checking in decoder 38. Further processing occurs in circuit 40, which can include various other decode or demodulation circuits.

FIG. 3 is a table showing a non-limiting example of a distance table that can be used in accordance with a non-limiting example of the present invention.

FIGS. 4 and 5 are tables showing performance results in accordance with a non-limiting example of the present invention.

FIGS. 3 and 4 provide a table, which compares the performance of the new FED technique to the standard CRC technique for several values of bit error rate (BER). The columns labelled Fast 16 and Fast 32 are the FED performance in accordance with a non-limiting example of the present invention, and correspond to the 16, 32 bit examples. The columns labelled Table 16 and Standard 32 are the performance of the standard CRC.

FIG. 3 shows the table of results with 100,000,000 192-bit packets. The error is defined as the CRC passing when errors are present in the received data.

FIG. 4 shows a table for the results with 10 million, 12,000-bit packets.

The "Fast" approach set forth will sometimes, but very infrequently, fail with two or three errors. The standard CRC approaches typically have a failure rate approaching $(\frac{1}{2})^N$ as the channel error rate approaches 50%. The results presented in the tables appear similar between the two approaches.

The system and method, in accordance with a non-limiting example of the present invention, provides a fast error detection mechanism using the multiply/accumulate function of a DSP or similar processor to speed up computation. The system can detect bit errors using only multiply/accumulate operations of packet data and the distance table. The distance table can be randomly generated, but with some constraints on the randomness.

The distance table has properties that allow the system to detect errors without remapping bit errors to another sequence. The system and method is such that the probability of double and triple errors creating a pattern that the system cannot detect is small.

Figure 6:
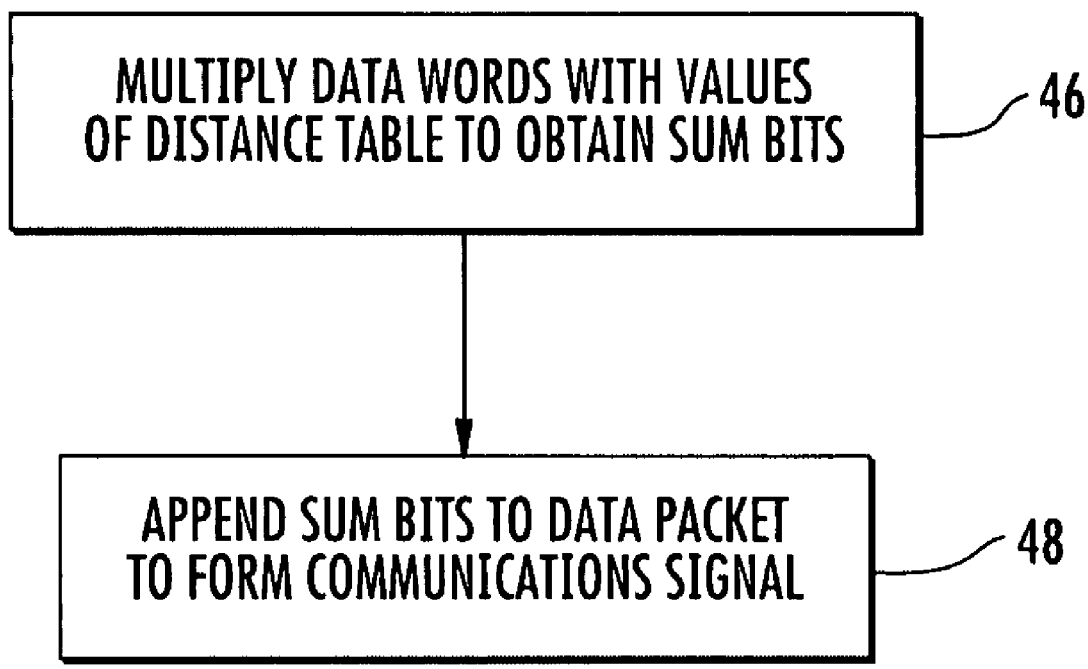
FIG. 6 is a high-level flowchart illustrating basic steps that can be used in accordance with a non-limiting example of the present invention.

FIG. 6 is a high-level flowchart illustrating a basic method of operation in accordance with a non-limiting example of the present invention. As illustrated, basic steps are first multiplying data words with the values of a distance table containing non-repeated n-bit multipliers having "m" number of one bits to obtain sum bits (block 46). The sum bits are appended to a data packet as an error correction code to form a communication signal to be transmitted (block 48).

Figure 7:
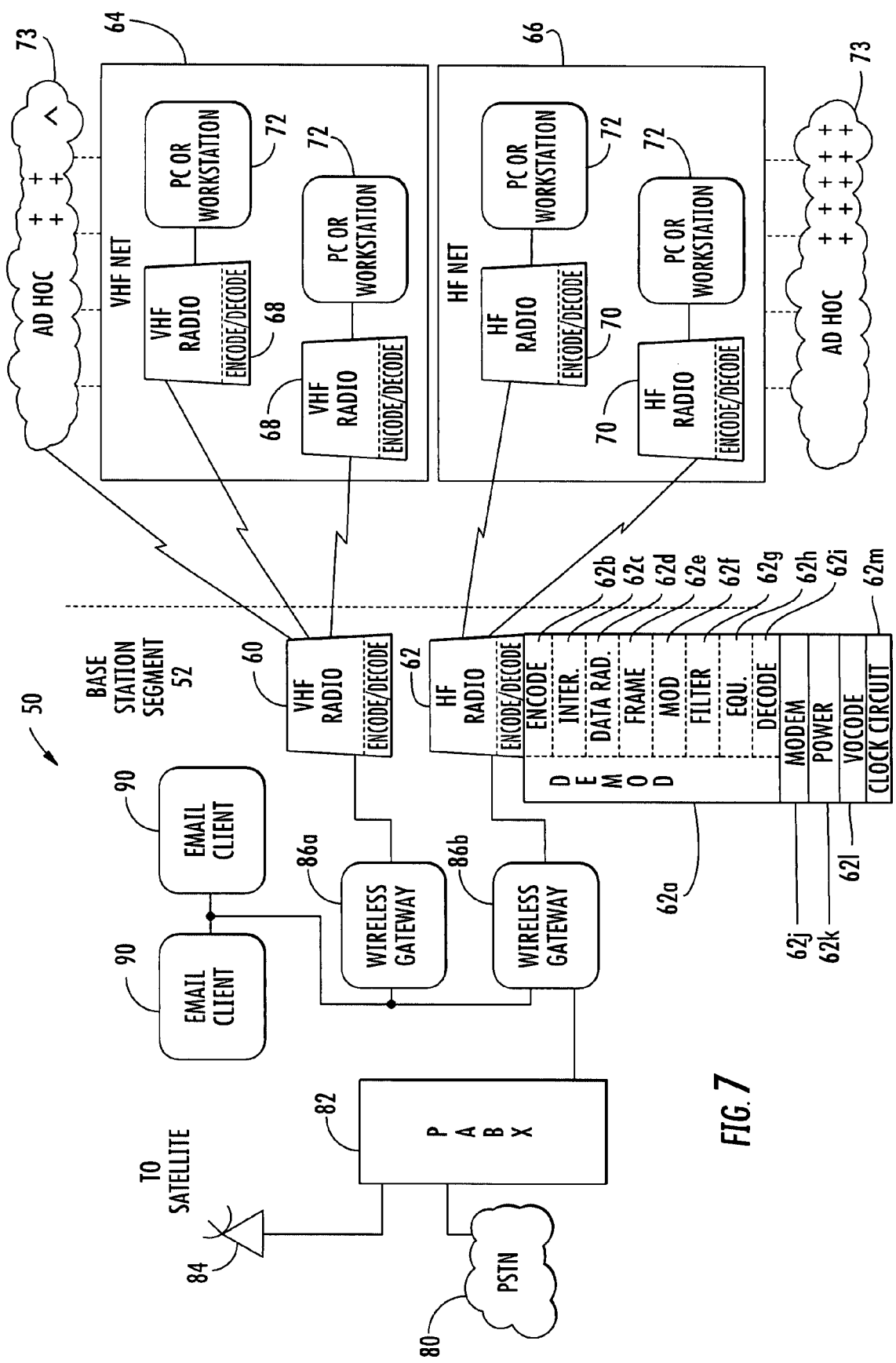
FIG. 7 is block diagram of an example of a communications system that can be used in accordance with non-limiting examples of the present invention.

An example of a communications system that can be used and modified for use with the present invention is now set forth with regard to FIG. 7.

An example of a radio that could be used with such system and method is a Falcon™ III radio manufactured and sold by Harris Corporation of Melbourne, Fla. It should be understood that different radios can be used, including software defined radios that can be typically implemented with relatively standard processor and hardware components. One particular class of software radio is the Joint Tactical Radio (JTR), which includes relatively standard radio and processing hardware along with any appropriate waveform software modules to implement the communication waveforms a radio will use. JTR radios also use operating system software that conforms with the software communications architecture (SCA) specification (see www.jtrs.saalt.mil), which is hereby incorporated by reference in its entirety. The SCA is an open architecture framework that specifies how hardware and software components are to interoperate so that different manufacturers and developers can readily integrate the respective components into a single device.

The Joint Tactical Radio System (JTRS) Software Component Architecture (SCA) defines a set of interfaces and protocols, often based on the Common Object Request Broker Architecture (CORBA), for implementing a Software Defined Radio (SDR). In part, JTRS and its SCA are used with a family of software re-programmable radios. As such, the SCA is a specific set of rules, methods, and design criteria for implementing software re-programmable digital radios.

The JTRS SCA specification is published by the JTRS Joint Program Office (JPO). The JTRS SCA has been structured to provide for portability of applications software between different JTRS SCA implementations, leverage commercial standards to reduce development cost, reduce development time of new waveforms through the ability to reuse design modules, and build on evolving commercial frameworks and architectures.

The JTRS SCA is not a system specification, as it is intended to be implementation independent, but a set of rules that constrain the design of systems to achieve desired JTRS objectives. The software framework of the JTRS SCA defines the Operating Environment (OE) and specifies the services and interfaces that applications use from that environment. The SCA OE comprises a Core Framework (CF), a CORBA middleware, and an Operating System (OS) based on the Portable Operating System Interface (POSIX) with associated board support packages. The JTRS SCA also provides a building block structure (defined in the API Supplement) for defining application programming interfaces (APIs) between application software components.

The JTRS SCA Core Framework (CF) is an architectural concept defining the essential, "core" set of open software Interfaces and Profiles that provide for the deployment, management, interconnection, and intercommunication of software application components in embedded, distributed-computing communication systems. Interfaces may be defined in the JTRS SCA Specification. However, developers may implement some of them, some may be implemented by non-core applications (i.e., waveforms, etc.), and some may be implemented by hardware device providers.

For purposes of description only, a brief description of an example of a communications system that could incorporate the Fast Error Detection (FED) method, in accordance in accordance with a non-limiting example, is described relative to a non-limiting example shown in FIG. 7. This high-level block diagram of a communications system 50 includes a base station segment 52 and wireless message terminals that could be modified for use with the present invention. The base station segment 52 includes a VHF radio 60 and HF radio 62 that communicate and transmit voice or data over a wireless link to a VHF net 64 or HF net 66, each which include a number of respective VHF radios 68 and HF radios 70, and personal computer workstations 72 connected to the radios 68,70. Ad-hoc communication networks 73 are interoperative with the various components as illustrated. The entire network can be ad-hoc and include source, destination and neighboring mobile nodes. Thus, it should be understood that the HF or VHF networks include HF and VHF net segments that are infrastructure-less and operative as the ad-hoc communications network. Although UHF radios and net segments are not illustrated, these could be included.

The HF radio can include a demodulator circuit 62a and appropriate convolutional encoder circuit 62b, block interleaver 62c, data randomizer circuit 62d, data and framing circuit 62e, modulation circuit 62f, matched filter circuit 62g, block or symbol equalizer circuit 62h with an appropriate clamping device, deinterleaver and decoder circuit 62i modem 62j, and power adaptation circuit 62k as non-limiting examples. A vocoder circuit 62l can incorporate the decode and encode functions and a conversion unit could be a combination of the various circuits as described or a separate circuit. A clock circuit 62m can establish the physical clock time and, if necessary, a virtual clock time. The network can have an overall network clock time. These and other circuits operate to perform any functions necessary for the present invention, as well as other functions suggested by those skilled in the art. Other illustrated radios, including all VHF mobile radios and transmitting and receiving stations can have similar functional circuits.

The base station segment 52 includes a landline connection to a public switched telephone network (PSTN) 80, which connects to a PABX 82. A satellite interface 84, such as a satellite ground station, connects to the PABX 82, which connects to processors forming wireless gateways 86a, 86b. These interconnect to the VHF radio 60 or HF radio 62, respectively. The processors are connected through a local area network to the PABX 82 and e-mail clients 90. The radios include appropriate signal generators and modulators.

An Ethernet/TCP-IP local area network could operate as a "radio" mail server. E-mail messages could be sent over radio links and local air networks using STANAG-5066 as second-generation protocols/waveforms, the disclosure which is hereby incorporated by reference in its entirety and, of course, preferably with the third-generation interoperability standard: STANAG-4538, the disclosure which is hereby incorporated by reference in its entirety. An interoperability standard FED-STD-1052, the disclosure which is hereby incorporated by reference in its entirety, could be used with legacy wireless devices. Examples of equipment that can be used in the present invention include different wireless gateway and radios manufactured by Harris Corporation of Melbourne, Fla. This equipment could include RF5800, 5022, 7210, 5710, 5285 and PRC 117 and 138 series equipment and devices as non-limiting examples.

These systems can be operable with RF-5710A high-frequency (HF) modems and with the NATO standard known as STANAG 4539, the disclosure which is hereby incorporated by reference in its entirety, which provides for transmission of long distance HF radio circuits at rates up to 9,600 bps. In addition to modem technology, those systems can use wireless email products that use a suite of data-link protocols designed and perfected for stressed tactical channels, such as the STANAG 4538 or STANAG 5066, the disclosures which are hereby incorporated by reference in their entirety. It is also possible to use a fixed, non-adaptive data rate as high as 19,200 bps with a radio set to ISB mode and an HF modem set to a fixed data rate. It is possible to use code combining techniques and ARQ.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An apparatus for generating a communications signal having an error detection mechanism, comprising:
a circuit that generates a data packet; and
an encoder that multiplies and accumulates data words with values in a distance table array containing non-repeated n-bit values having "m" number of one bits set to obtain an accumulated sum and appends the sum bits to the data packet as an error detection code to form a communications signal.

2. The apparatus according to claim 1, which further comprises a digital signal processor (DSP) having a multiply/accumulate (MAC) unit for multiplying and accumulating values from the distance table with the data words.

3. The apparatus according to claim 2, wherein said DSP is operative for computing a product and adding the result to the accumulator with integers as a computed modulo of a power of two.

4. The apparatus according to claim 1, wherein said encoder is operative for multiplying the data words with values from the distance table containing pre-computed non-repeated 16-bit values.

5. The apparatus according to claim 1, wherein said encoder is operative for obtaining "x" number of bits as a first number of bits for the accumulated sum and reducing the sum bits down to a "y" number of sum bits.

6. The apparatus according to claim 1, and further comprising a parity bit added to the sum bits that are appended to the data packet.

7. The apparatus according to claim 1, wherein the values of the distance table are pre-computed and optimized to give bit errors good distance properties.

8. A system for communicating, comprising:
a transmitter, comprising,
a circuit that generates a data packet; and
an encoder that multiplies and accumulates data words with values of a distance table containing non-repeated, n-bit multipliers having "m" number of one bits that are set to obtain the accumulated sum bits, wherein said encoder circuit appends the sum bits to the data packet as an error detection code to form a communications signal that is transmitted; and
a receiver that receives the communications signal after it is transmitted, and comprising
a decoder circuit that processes the signal using the values of the distance table to detect errors in communication based on the accumulated sum bits appended to the data packet.

9. The system according to claim 8, wherein said transmitter and receiver each include a digital signal processor (DSP) and multiply/accumulate (MAC) unit operative for computing the accumulated sum bits.

10. A method of generating a communications signal having an error detection mechanism, comprising:
multiplying and accumulating data words with the values of a distance table containing non-repeated n-bit values having "m" number of one bits that are set to obtain an accumulated sum that is "x" bits wide; and
appending the accumulated sum bits to a data packet as an error detection code to form a communications signal.

11. The method according to claim 10, which further comprises multiplying and accumulating the data words within a multiply/accumulate (MAC) unit of a digital signal processor (DSP).

12. The method according to claim 10, which further comprises multiplying the data words with values from the distance table containing 16 bit values.

13. The method according to claim 10, which further comprises obtaining "x" number of bits as a first number of accumulated sum bits and reducing the sum bits down to a "y" number of sum bits.

14. The method according to claim 10, which further comprises replacing a bit zero of the sum bits with a parity bit.

15. The method according to claim 10, wherein the values of the distance table are pre-computed and optimized to give bit errors good distance properties.

16. The method according to claim 10, which further comprises computing a product and adding the result to an accumulator with integers as a computed modulo of a power of two.

17. The method according to claim 10, which further comprises receiving the communications signal and decoding the signal within a receiver using the values of the distance table to detect errors in communication.

* * * * *